United States Patent
Chang et al.

(10) Patent No.: US 10,332,974 B2
(45) Date of Patent: Jun. 25, 2019

(54) METHOD OF MAKING A SEMICONDUCTOR DEVICE

(71) Applicant: National Chiao Tung University, Hsinchu (TW)

(72) Inventors: Chun-Yen Chang, Zhubei (TW); Chen-Yu Li, Zhuqi Township (TW); Hao-Chung Kuo, Zhubei (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 15/163,173

(22) Filed: May 24, 2016

(65) Prior Publication Data
US 2016/0365477 A1    Dec. 15, 2016

(30) Foreign Application Priority Data
Jun. 12, 2015   (TW) .............................. 104119118 A (51) Int. Cl.
| | |
|---|---|
| *H01L 33/00* | (2010.01) |
| *H01L 29/66* | (2006.01) |
| *H01L 21/02* | (2006.01) |
| *H01L 21/324* | (2006.01) |
| *H01L 33/12* | (2010.01) |

(Continued)

(52) U.S. Cl.
CPC .... *H01L 29/66462* (2013.01); *H01L 21/0254* (2013.01); *H01L 21/02414* (2013.01); *H01L 21/02458* (2013.01); *H01L 21/02502* (2013.01); *H01L 21/02617* (2013.01); *H01L 21/3245* (2013.01); *H01L 33/007* (2013.01); *H01L 33/12* (2013.01); *H01L 29/2003* (2013.01); *H01L 29/7786* (2013.01)

(58) Field of Classification Search
None
See application file for complete search history.

(56) References Cited

U.S. PATENT DOCUMENTS

| | | | |
|---|---|---|---|
| 7,977,673 B2 | 7/2011 | Ichinose et al. | |
| 2003/0070607 A1* | 4/2003 | Koike ................... | C30B 25/02 117/84 |

(Continued)

OTHER PUBLICATIONS

Shun Ito, Kenichiro Takeda, Kengo Nagata, Hiroki Aoshima, Kosuke Takehara, Motoaki Iwaya, Tetsuya Takeuchi, Satoshi Kamiyama, Isamu Akasaki and Hiroshi Amano, "Growth of GaN and AlGaN on (100) β-Ga2O3 substrates," Phys. Status Solidi C 9, No. 3-4, 519-522 (2012).

(Continued)

*Primary Examiner* — Asok K Sarkar
(74) *Attorney, Agent, or Firm* — Womble Bond Dickinson (US) LLP (57) ABSTRACT

A method of making a semiconductor device includes:
(a) providing a semiconductor substrate that is made from a material containing an element of boron group;
(b) forming on the semiconductor substrate a buffer structure that includes an aluminum nitride buffer film formed using a physical vapor deposition technique; and
(c) forming on the buffer structure a semiconductor unit that includes a GaN-based epitaxial layer, the GaN-based epitaxial layer having a hexagonal crystal structure and being formed using a chemical vapor deposition technique.

6 Claims, 9 Drawing Sheets

(51) Int. Cl.
  *H01L 29/778* (2006.01)
  *H01L 29/20* (2006.01)

(56) References Cited

U.S. PATENT DOCUMENTS

| 2013/0082274 | A1* | 4/2013 | Yang | H01L 33/12 |
| | | | | 257/76 |
| 2015/0236121 | A1* | 8/2015 | Chiu | H01L 29/66462 |
| | | | | 257/194 |
| 2015/0340553 | A1* | 11/2015 | Li | H01L 33/32 |
| | | | | 257/13 |

OTHER PUBLICATIONS

S. Ohira, N. Suzuki, H. Minami, K. Takahashi, T. Araki and Y. Nanishi, "Growth of hexagonal GaN films on the nitridated β-Ga2O3 substrates using RF-MBE" Phys. Stat. Sol. (c) 4, No. 7, 2306-2309 (2007).

* cited by examiner

METHOD OF MAKING A SEMICONDUCTOR DEVICE

CROSS-REFERENCE TO RELATED APPLICATION

This application claims priority of Taiwanese Application No. 104119118, filed on Jun. 12, 2015.

FIELD

The disclosure relates to a method of making a semiconductor device, more particularly to a method of making a semiconductor device with an aluminum nitride buffer film.

BACKGROUND

GaN-based semiconductor materials are widely applied in semiconductor devices, such as LEDs, due to the property of wide band gap.

Conventionally, a GaN layer is formed on a sapphire substrate using metal organic chemical vapor deposition (MOCVD) techniques. Due to considerable difference in lattice parameters between the sapphire substrate and the GaN layer, lattice dislocation may occur in the GaN layer. In addition, due to the large difference in thermal expansion coefficient between the sapphire substrate and the GaN layer, stress is likely to occur at an interface between the sapphire substrate and the GaN layer, resulting in fracture of the GaN layer.

In order to overcome the aforesaid problems, a $Ga_2O_3$ substrate which has a lattice parameter similar to that of the GaN layer can be used as a substitute for the sapphire substrate.

However, the $Ga_2O_3$ substrate is likely to be degraded during epitaxial formation of the GaN layer under a $H_2$ atmosphere and result in the formation of a discontinuous GaN layer.

To overcome the aforesaid degradation problem, a GaN seed layer with a thickness around 30 nm to 50 nm is first formed on the $Ga_2O_3$ substrate, followed by epitaxial growth of a GaN layer on the GaN seed layer. However, when the GaN seed layer is too thick, GaN island grains may be generated on a surface of the GaN seed layer and reduce the quality of the GaN layer. In contrast, when the GaN seed layer is too thin, the effect of preventing the $Ga_2O_3$ substrate from degradation may be reduced.

An alternative solution to the degradation problem is to form the GaN layer in an $O_2$ atmosphere rather than in the $H_2$ atmosphere. Unfortunately, the GaN layer thus formed has a cubic crystal structure that is worse in property than the hexagonal crystal structure formed in the $H_2$ atmosphere.

SUMMARY

Therefore, an object of the disclosure is to provide a method of making a semiconductor device that can alleviate at least one of the drawbacks of the prior arts.

According to the disclosure, a method of making a semiconductor device includes: (a) providing a semiconductor substrate that is made from a material containing an element of boron group; (b) forming on the semiconductor substrate a buffer structure that includes an aluminum nitride buffer film formed using a physical vapor deposition technique; and (c) forming on the buffer structure a semiconductor layered unit that includes a GaN-based epitaxial layer, the GaN-based epitaxial layer having a hexagonal crystal structure and being formed by a chemical vapor deposition technique.

BRIEF DESCRIPTION OF THE DRAWINGS

Other features and advantages of the disclosure will become apparent in the following detailed description of the embodiments with reference to the accompanying drawings, of which:

FIG. 14 is a fluorescence microscope image of the semi-product of Example 6;

DETAILED DESCRIPTION

Before the disclosure is described in greater detail, it should be noted that like elements are denoted by the same reference numerals throughout the disclosure.

The first embodiment of a method of making a semiconductor device according to the disclosure includes a substrate-providing step (step (a)), a buffer structure-forming step (step (b)), and a semiconductor unit-forming step (step (c)). The semiconductor device thus obtained is shown in FIG. 1.

Figure 1:
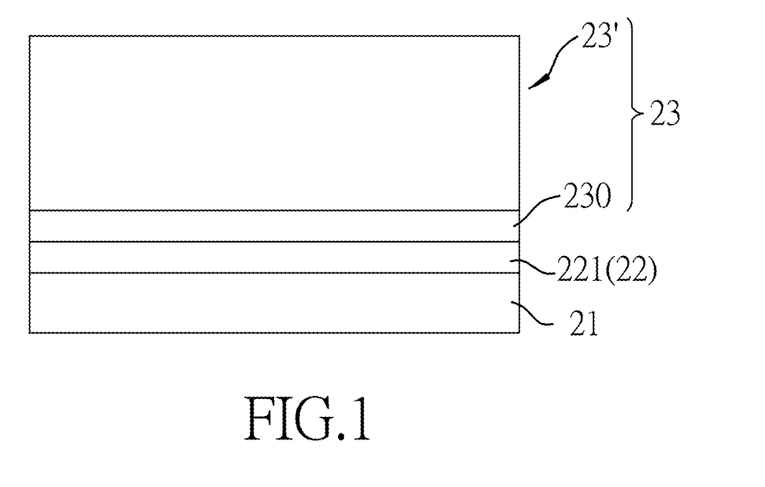
FIG. 1 is a schematic view illustrating a semiconductor device made from a first embodiment of a method of making a semiconductor device according to the disclosure.

In step (a), a semiconductor substrate 21 is provided (see FIG. 1). The semiconductor substrate 21 is made from a material containing an element of boron group. In certain embodiments, the semiconductor substrate 21 is made from a material such as $Ga_2O_3$, $Al_2O_3$, or GaN.

In step (b), a buffer structure 22 is formed on the semiconductor substrate 21 (see FIG. 1). In this embodiment, the buffer structure 22 is composed of an aluminum nitride buffer film 221 that is formed using a physical vapor deposition (PVD) technique.

More specifically, the semiconductor substrate 21 is disposed on a base in a chamber (not shown) and heated to a temperature ranging from 300° C. to 700° C. Then, the aluminum nitride buffer film 221 is continuously deposited on the semiconductor substrate 21 using the PVD technique. The PVD technique may be a sputter technique or a molecular beam epitaxy technique.

In step (c), a semiconductor unit 23 is formed on the buffer structure 22 (see FIG. 1). The semiconductor unit 23 includes a GaN-based epitaxial layer 230 that has a hexagonal crystal structure and that is formed using a chemical vapor deposition (CVD) technique. To be specific, an assembly containing the semiconductor substrate 21 and the buffer structure 22 is disposed on a base in another chamber (not shown), followed by heating the assembly to a temperature ranging from 1100° C. to 1200° C. in an atmosphere containing nitrogen, hydrogen, or the combination thereof. The atmosphere may optionally contain ammonia. The GaN-based epitaxial layer 230 is deposited on the buffer structure 21 using hydrogen as a carrier gas by the chemical vapor deposition (CVD) technique. A light-emitting diode (LED) or a high electron mobility transistor (HEMT) 23' is then grown on the GaN-based epitaxial layer 230. The LED or HEMT 23' and the GaN-based epitaxial layer 230 cooperatively constitute the semiconductor unit 23. The chemical vapor deposition technique used in formation of the GaN-based epitaxial layer 230 is a metal organic chemical vapor deposition technique (MOCVD) or a hydride vapor phase epitaxy technique (HVPE).

Figure 3:
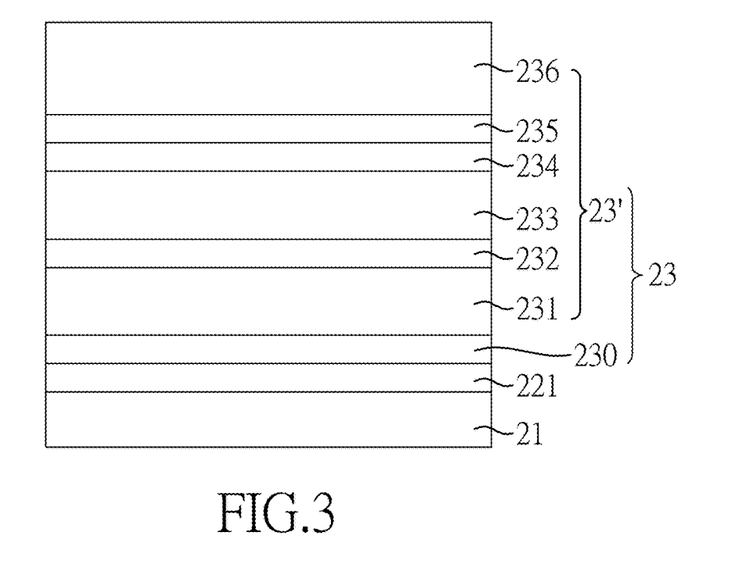
FIG. 3 is a schematic view illustrating a semiconductor device of Example 1.
Figure 4:
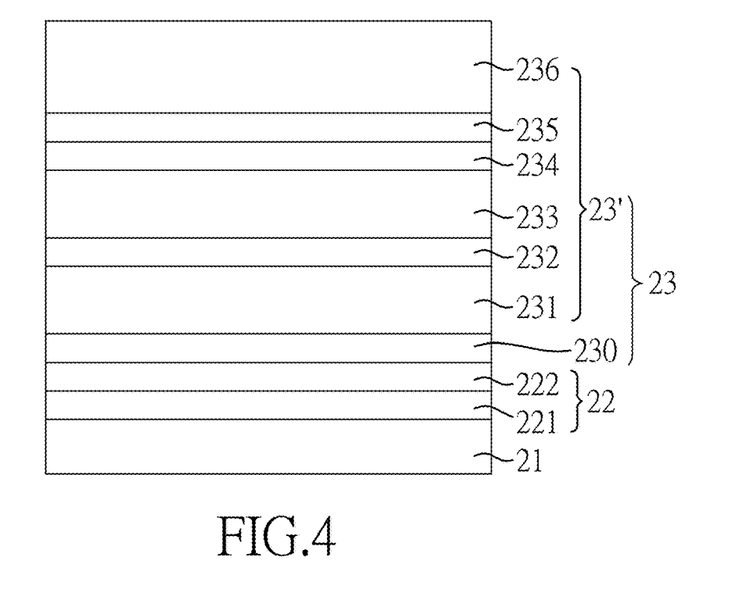
FIG. 4 is a schematic view illustrating a semiconductor device of Example 2.

The LED 23' may include a first electrode layer 231, a pre-strained layer 232, a multi-quantum-well layer 233, a barrier layer 234, an electron-blocking layer 235, and a second electrode layer 236 (see FIGS. 3 and 4). The HEMT 23' may include a buffer layer 237, a channel layer 238, a barrier layer 239, a capping layer 240, and an electrode layer 241 (see FIG. 5).

In the method of this disclosure, based on actual requirements, step (c) may further include doping the GaN-based epitaxial layer 230 with, e.g., carbon element or iron element.

The aluminum nitride buffer film 221 of the buffer structure 22 has properties of high hardness, good thermal conductivity, anti-corrosion, and superior heat resistance. Furthermore, since the aluminum nitride buffer film 221 formed using the PVD technique under the aforesaid conditions has a compact layer structure, the aluminum nitride buffer film 221 thus formed may efficiently prevent degradation of the semiconductor substrate 21 caused by the hydrogen atmosphere. Moreover, since the aluminum nitride buffer film 221 has a hexagonal crystal structure, the GaN-based epitaxial layer 230 that is deposited thereon thus has a more desirable hexagonal crystal structure. In addition, threading dislocations (TDs) may be reduced due to similar lattice constants of the aluminum nitride buffer film 221 and the GaN-based epitaxial layer 230.

Figure 2:
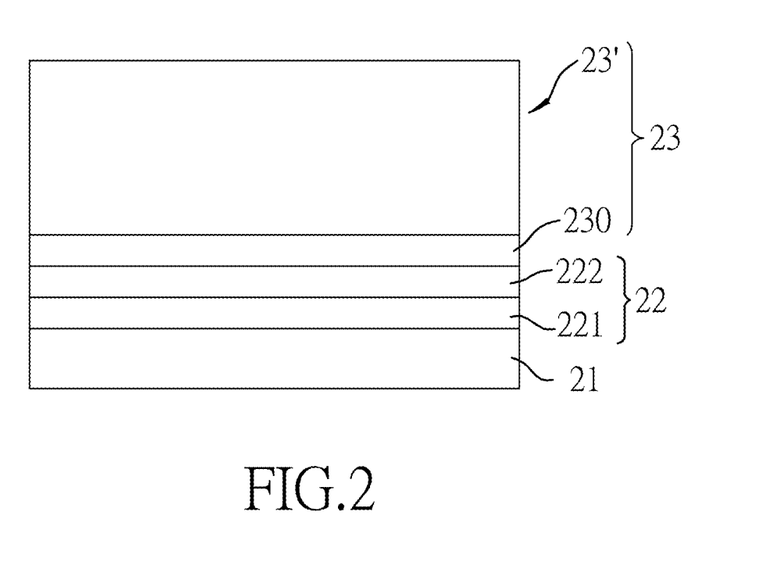
FIG. 2 is a schematic view illustrating a semiconductor device made from a second embodiment of a method of making a semiconductor device according to the disclosure.

FIG. 2 shows a semiconductor device obtained by a second embodiment of a method of making a semiconductor device according to the disclosure. The semiconductor device obtained by the second embodiment is similar to the semiconductor device obtained by the first embodiment, except that the buffer structure 22 further includes a GaN buffer film 222 formed between the aluminum nitride buffer film 221 and the GaN-based epitaxial layer 230. Specifically, the method of the second embodiment is similar to that of the first embodiment, except that in step (b) of the second embodiment, after the aluminum nitride buffer film 221 is deposited, the GaN buffer film 222 is further formed thereon using the chemical vapor deposition technique under a condition in which the semiconductor substrate 21 and the aluminum nitride buffer film 221 are heated to a temperature ranging from 500° C. to 600° C. and hydrogen is used as a carrier gas. The GaN buffer film 222 is a low-temperature GaN buffer film (LT-GaN buffer film).

It is noted that threading dislocations are likely to occur as a result of heteroepitaxial growth. With the GaN buffer film 222, the GaN-based epitaxial layer 230 can be laterally grown, so as to release the stress generated by the difference in lattice constants, thereby reducing the threading dislocations in the semiconductor device. In addition, the low temperature GaN-based epitaxial layer 230 has weak bonding strength, and thus the semiconductor unit 23 is easily separated from the buffer structure 22 using a lift-off technique.

Preferably, the aluminum nitride buffer film 221 has a thickness ranging between 5 nm and 100 nm. A thickness of the aluminum nitride buffer film 221 equal to or greater than 5 nm could ensure sufficient protection of the semiconductor substrate 21 from degradation. The aluminum nitride buffer film 221 with a thickness greater than 100 mm may adversely affect the quality of the GaN-based epitaxial layer 230. The following examples and comparative examples are provided to illustrate the embodiments of the disclosure, and should not be construed as limiting the scope of the disclosure.

EXAMPLES

Example 1

A semiconductor substrate 21 made from $\beta$-$Ga_2O_3$ was cleaned with acetone to remove organic substances from the semiconductor substrate 21, and further cleaned with deionized water to remove acetone from the semiconductor substrate 21, followed by drying of the semiconductor substrate 21.

The cleaned semiconductor substrate 21 was disposed on a base in a chamber of a sputter system, and subsequently heated to and maintained at 350° C. An aluminum nitride buffer film 221 with a thickness of 25 nm was then deposited on the semiconductor substrate 21 under conditions in which a pressure of the chamber was less than $10^{-4}$ torr, nitrogen was used as a carrier gas, and aluminum nitride was used as a target.

The semiconductor substrate 21 and the aluminum nitride buffer film 221 were disposed on a base in a chamber of an MOCVD system (not shown), and heated from 100° C. to 1140° C. to anneal the aluminum nitride buffer film 221 in hydrogen atmosphere for 5 to 20 minutes. A GaN-based semiconductor layer 230 was then formed on the aluminum nitride buffer film 221 under conditions in which hydrogen was used as a carrier gas, and the semiconductor substrate 21 and the aluminum nitride buffer film 221 were at a temperature of 1160° C. so as to form a semi-product of Example 1.

An InGaN-based LED structure was then formed on the semi-product. More specifically, a first electrode layer 231, a pre-strained layer 232, a multi-quantum-well layer 233, a barrier layer 234, an electron-blocking layer 235, and a second electrode layer 236 were then laminated, in that order, on the GaN-based epitaxial layer 230 of the aforesaid semi-product in the MOCVD system under conditions in which the semi-product was heated to 1150° C. and hydrogen was used as a carrier gas. The GaN-based epitaxial layer 230 and the InGaN-based LED structure, including the first electrode layer 231, the pre-strained layer 232, the multiquantum-well layer 233, the barrier layer 234, the electron-blocking layer 235, and the second electrode layer 236, cooperated with the semiconductor substrate 21 and the aluminum nitride buffer film 221 to form a semiconductor device of Example 1 (see FIG. 3). The first electrode layer 231 was made from n-GaN, and able to provide and transfer electrons. The pre-strained layer 232 and the multi-quantum-well layer 233 were both InGaN/GaN structures, and able to confine electrons and holes therein to improve illumination intensity. The barrier layer 234 was made from p-AlGaN. The electron-blocking layer 235 was made from p-InAlGaN. The second electrode layer 236 was made from p-GaN, and able to provide and transfer holes.

Example 2

A semiconductor device of Example 2 has a structure similar to that of the semiconductor device of Example 1, except that a LT-GaN buffer film 222 having a thickness of 1 µm was further formed on the aluminum nitride buffer film 221 (see FIG. 4). To be specific, the LT-GaN buffer film 222 was deposited on the aluminum nitride buffer film 221 in the MOCVD system under conditions in which the semiconductor substrate 21 and the aluminum nitride buffer film 221 were heated to 570° C., and hydrogen was used as a carrier gas. The aluminum nitride buffer film 221 and the LT-GaN buffer film 222 cooperatively constituted the buffer structure 22.

Example 3

Figure 5:
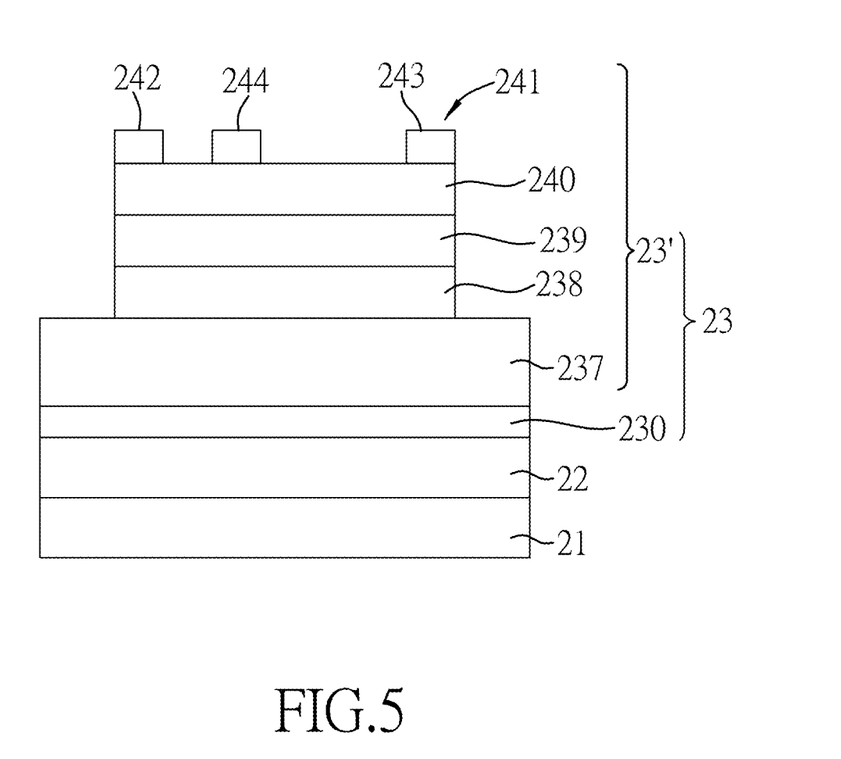
FIG. 5 is a schematic view illustrating a semiconductor device of Example 3.

A semiconductor device of Example 2 has a structure similar to that of the semiconductor device of Example 1, except that a high electron mobility transistor (HEMT) structure was used in this embodiment to replace the InGaN-based LED structure in Example 1. To be specific, as shown in FIG. 5, a buffer layer 237, a channel layer 238, a barrier layer 239, a capping layer 240, and an electrode layer 241 were laminated on the GaN-based semiconductor layer 230 to form the HEMT structure, and cooperated with the GaN-based semiconductor layer 230 to form the semiconductor unit 23. The buffer layer 237 and the channel layer 238 were both made from GaN. The channel layer 238 differed from the buffer layer in that the channel layer 238 was patterned into a predetermined shape using an inductively coupled plasma (ICP) etching technique. The barrier layer 239 was made from InAlGaN. The capping layer 240 was made from GaN. The electrode layer 241 was formed using photolithography and included spaced apart source and drain electrodes 242, 243, and a gate electrode 244 that was disposed between the source electrode 242 and the drain electrode 243.

Example 4

A semiconductor device of Example 4 has a structure similar to that of the semiconductor device of Example 3, except that a LT-GaN buffer film having a thickness of 1 to 2 µm was further formed on the aluminum nitride buffer film.

Example 5

A semiconductor device of Example 5 has a structure similar to that of the semiconductor device of Example 1, except that the semiconductor substrate was a sapphire substrate with a flat surface, and that the GaN-based epitaxial layer was formed using a hydride vapor phase epitaxy (HVPE) technique under hydrogen atmosphere. The GaN-based epitaxial layer 230 had a thickness of 2 µm.

Example 6

A semiconductor device of Example 6 has a structure similar to that of the semiconductor device of Example 5, except that the semiconductor substrate 21 was a sapphire substrate with a patterned and roughened surface.

Comparative Example 1

A semiconductor device of Comparative Example 1 has a structure similar to that of the semiconductor device of Example 2, except that the semiconductor substrate was a sapphire substrate, and the semiconductor device of Comparative Example 2 was free of the aluminum nitride buffer film. More specifically, the LT-GaN buffer film was directly formed on the sapphire substrate using the MOCVD technique. Furthermore, a first GaN-based epitaxial layer with a thickness greater than 1 µm and a second GaN-based epitaxial layer with a thickness greater than 5 µm were sequentially formed on the LT-GaN buffer film using a MOCVD technique and a HPVE technique, respectively.

Comparative Example 2

A GaN-based epitaxial layer was directly formed on a sapphire substrate using procedures similar to the procedures of forming the GaN-based epitaxial layer on the aluminum nitride buffer film shown in Example 1, so as to form a product of Comparative Example 2.

<Result>

Figure 6:
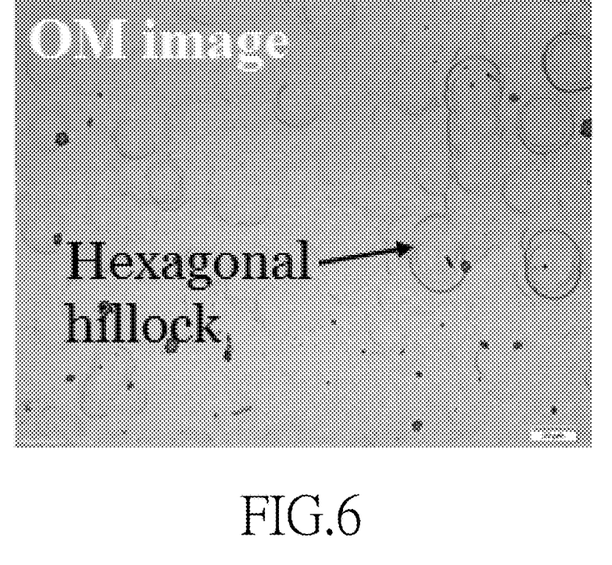
FIG. 6 is an optical microscope image of a semi-product obtained in Example 1.
Figure 7:
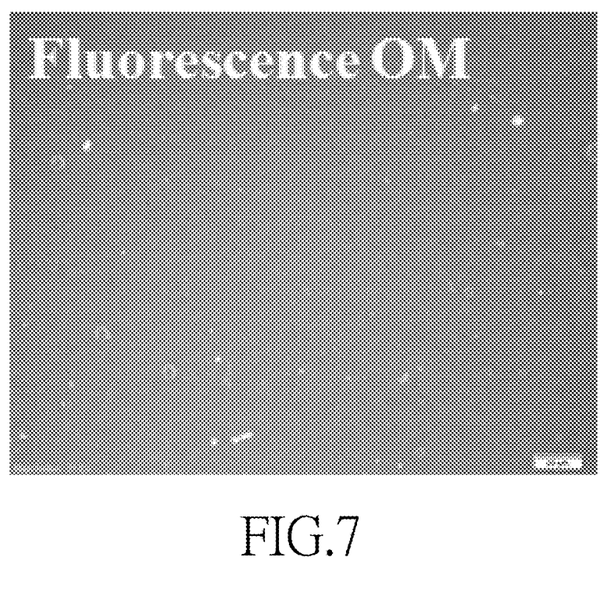
FIG. 7 is a fluorescence microscope image of the semi-product of Example 1.
Figure 8:
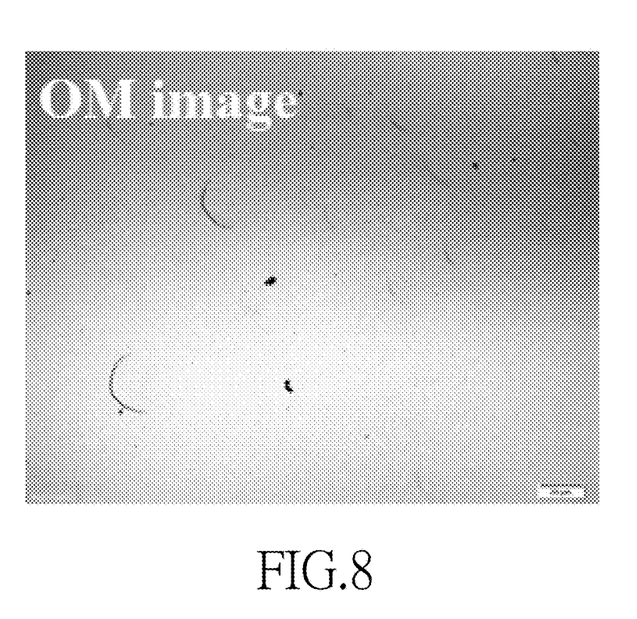
FIG. 8 is an optical microscope image of a semi-product obtained in Comparative Example 2.
Figure 9:
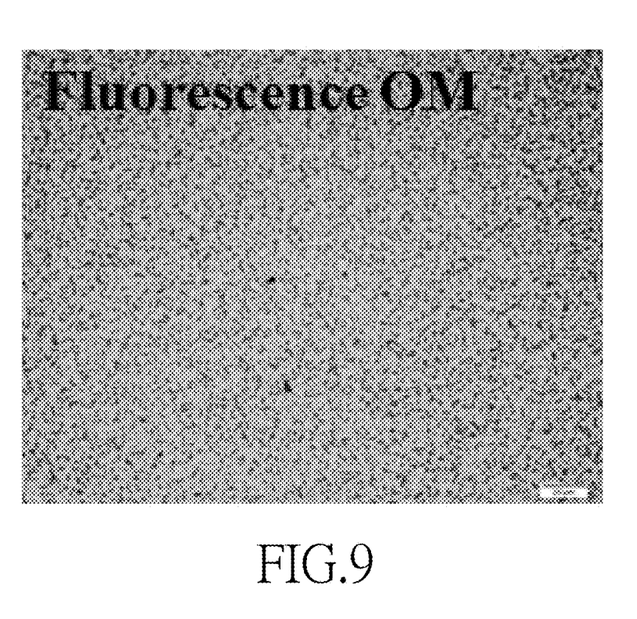
FIG. 9 is a fluorescence microscope image of the semi-product of Comparative Example 2.

FIGS. 6 and 7 respectively show an optical microscope image and a fluorescence microscope image of the semi-product of Example 1. FIG. 6 illustrates that the GaN-based epitaxial layer 230 has a hexagonal crystal structure. FIG. 7 reveals that a single emission wavelength was observed, and indicates relatively few dislocations in the GaN-based epitaxial layer 230 due to the presence of the aluminum nitride buffer film 221. FIGS. 8 and 9 respectively show an optical microscope image and a fluorescence microscope image of the semi-product of Comparative Example 2. FIG. 8 shows that the semi-product does not have a hexagonal crystal structure. In FIG. 9, different emission wavelengths were observed, indicating that the GaN-based epitaxial layer 230 has more dislocations.

Figure 10:
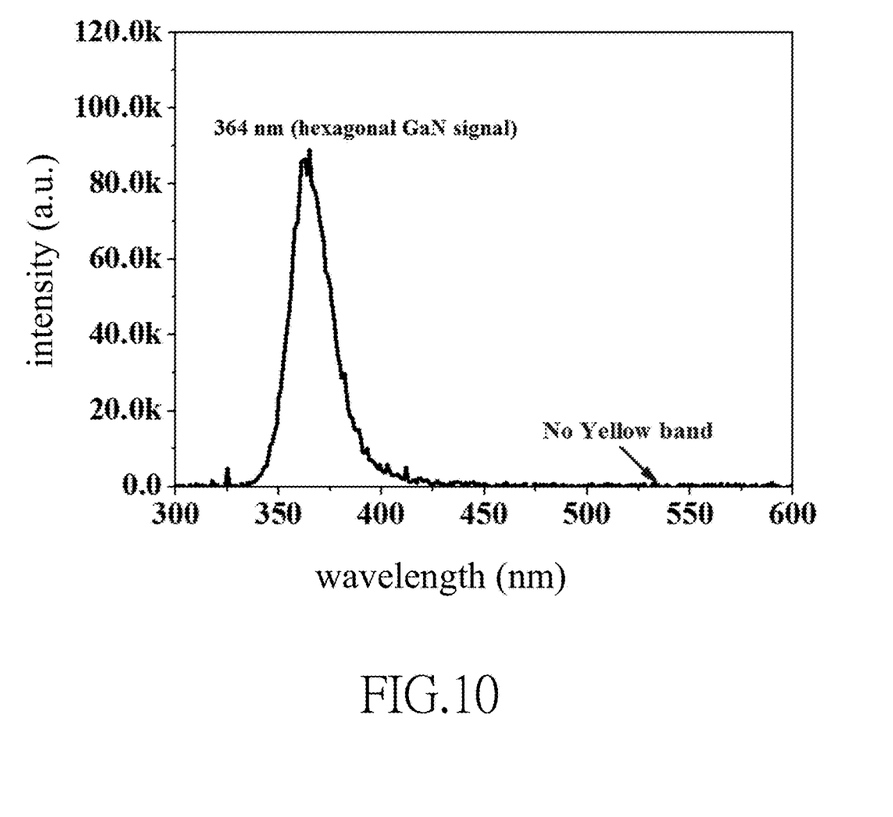
FIG. 10 shows an optical excitation spectrum of the semi-product of Example 1.

FIG. 10 shows an optical excitation spectrum of the semi-product of Example 1. The result shows that signal for a hexagonal crystal structure was detected (a wavelength of 364 nm), and a yellow band for dislocations was not detected.

The high quality aluminum nitride buffer film 221 may reduce the current that flows into the semiconductor substrate and thus reduces the leakage current in the LED structure. For the HEMT structure, the high quality aluminum nitride buffer film 221 may reduce the leakage current and increase breakdown voltage thereof.

Figure 11:
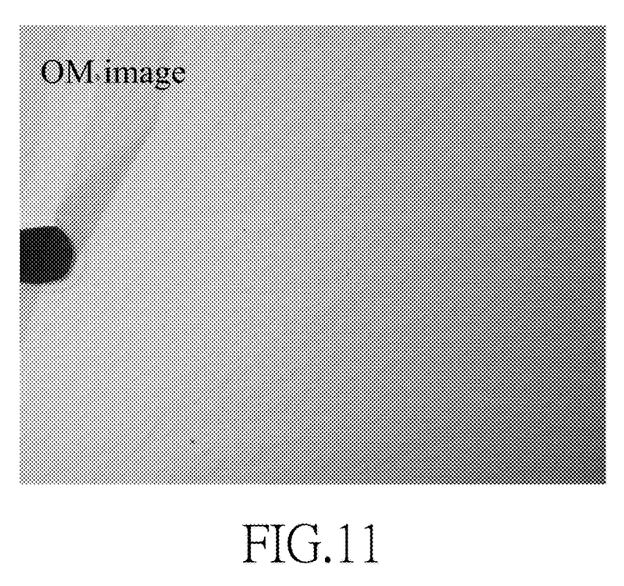
FIG. 11 is an optical microscope image of a semi-product obtained in Example 5.
Figure 12:
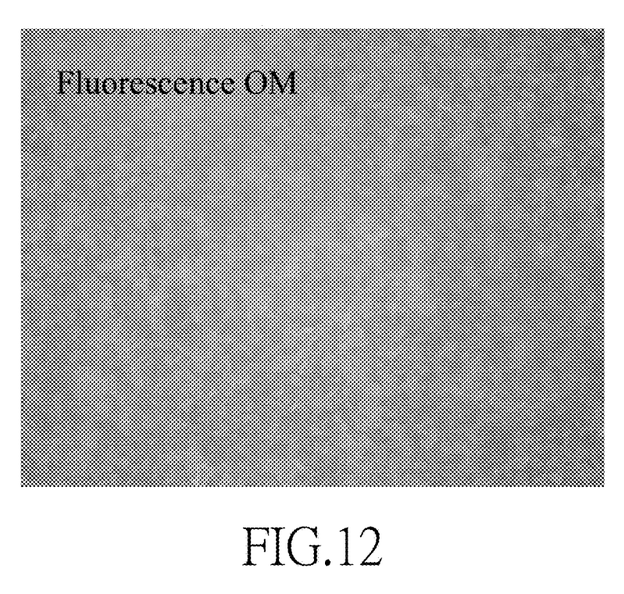
FIG. 12 is a fluorescence microscope image of the semi-product of Example 5.
Figure 13:
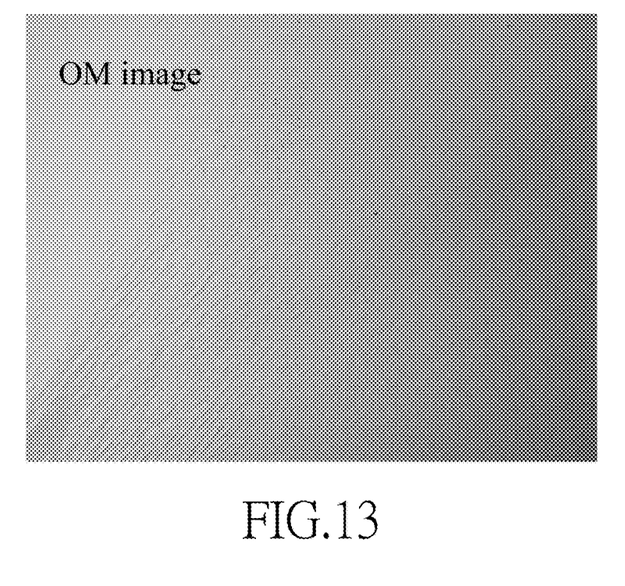
FIG. 13 is an optical microscope image of a semi-product obtained in Example 6.
Figure 14:
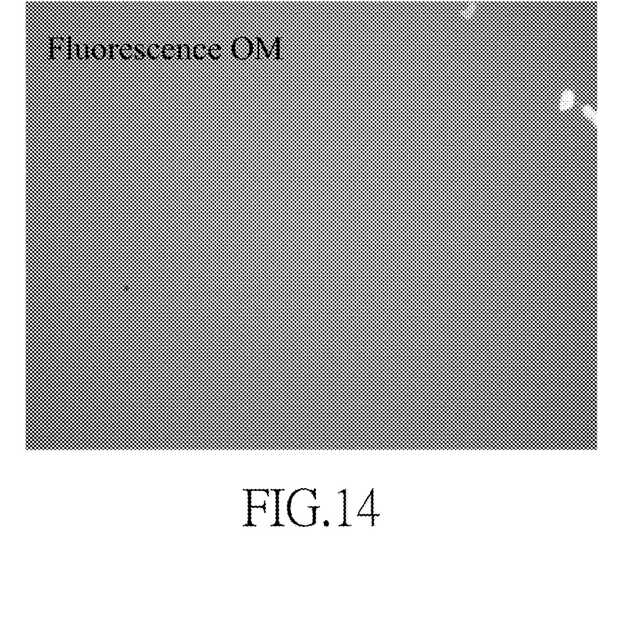

FIGS. 11 and 12 respectively show an optical microscope image and a fluorescence microscope image of the GaN-based epitaxial layer of the semi-product of Example 5, and FIGS. 13 and 14 respectively show an optical microscope image and a fluorescence microscope image of the GaN-based epitaxial layer of the semi-product of Example 6. The results show that the GaN-based epitaxial layer grown on the aluminum nitride buffer film 221 using the HVPE technique has relatively few dislocations.

Figure 15:
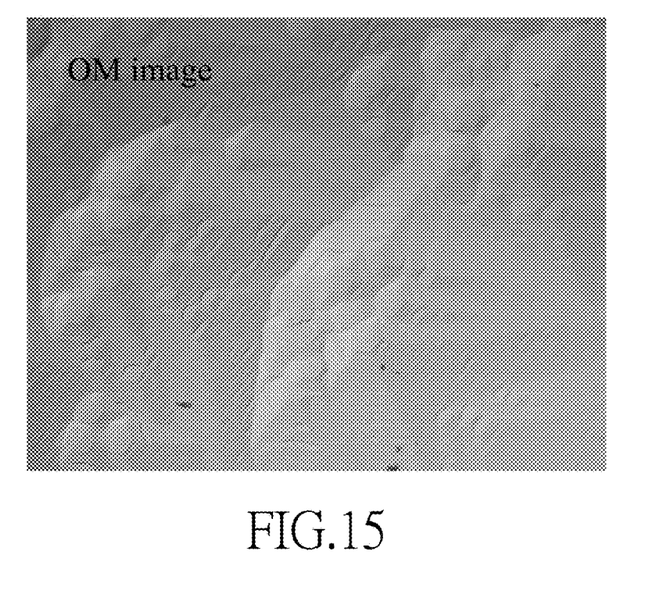
FIG. 15 is an optical microscope image of a semi-product obtained in Comparative Example 1.
Figure 16:
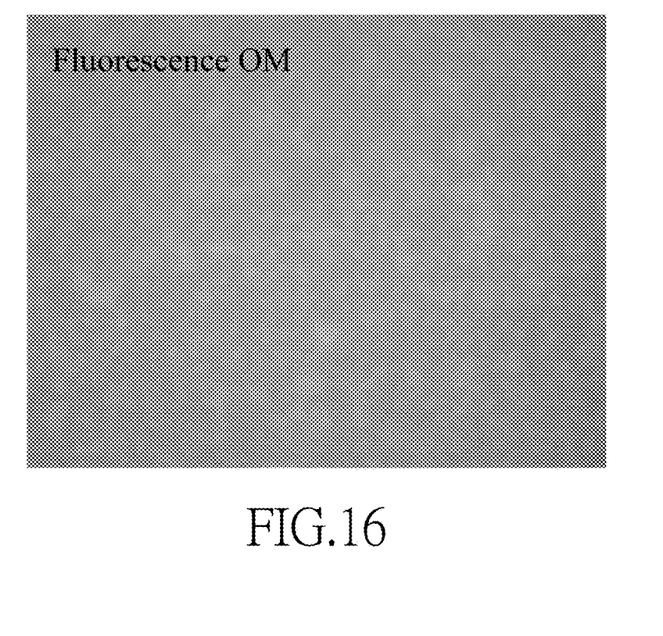
FIG. 16 is a fluorescence microscope image of the semi-product of Comparative Example 1.

FIGS. 15 and 16 respectively show an optical microscope image and a fluorescence microscope image of the semi-product in Comparative Example 1. The second GaN-based epitaxial layer grown on the first GaN-based epitaxial layer and the LT-GaN buffer film has an uneven surface (see FIG. 15) and light spots with varying brightness (see FIG. 16). The results indicate that the GaN-based epitaxial layer directly formed on the LT-GaN buffer film is of inferior quality, which may adversely affect the quality and characteristic of the LED or HEMT structure formed thereon.

In addition, FIGS. 11 and 15 show that the GaN-based epitaxial layer grown on the aluminum nitride buffer film has a surface quality superior to the second GaN-based epitaxial layer grown on the first GaN-based epitaxial layer and the LT-GaN buffer film, and may simplify the method of making the semiconductor device.

In summary, with the formation of the buffer structure using particular techniques, degradation of the substrate under the $H_2$ atmosphere can be prevented, and the GaN-based epitaxial layer thus formed has the more desirable hexagonal structure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method of making a semiconductor device, comprising:
   (a) providing a semiconductor substrate that is made from a material containing an element of boron group;
   (b) forming on the semiconductor substrate a buffer structure that includes an aluminum nitride buffer film formed using a physical vapor deposition technique under a condition that the semiconductor substrate is heated to a temperature ranging from 300° C. to 700° C.; and
   (c) forming on the buffer structure a semiconductor unit that includes a GaN-based epitaxial layer and doping the GaN-based epitaxial layer with iron element, the GaN-based epitaxial layer having a hexagonal crystal structure and being formed using a chemical vapor deposition technique;
   wherein the buffer structure further includes a GaN buffer film formed between the aluminum nitride buffer film and the GaN-based epitaxial layer, the GaN buffer film being formed using a chemical vapor deposition technique under a condition that the semiconductor substrate and the aluminum nitride buffer film are heated to a temperature ranging from 500° C. to 600° C. and hydrogen is used as a carrier gas.

2. The method of claim 1, wherein, in step (c), the forming of the semiconductor unit is conducted under a condition that the semiconductor substrate and the buffer structure are heated to a temperature ranging from 1100° C. to 1200° C. and hydrogen is used as a carrier gas.

3. The method of claim 1, wherein step (c) includes forming the GaN-based epitaxial layer on the buffer structure and laminating a first electrode layer, a pre-strained layer, a multi-quantum-well layer, a barrier layer, an electron-blocking layer, and a second electrode layer on the GaN-based epitaxial layer.

4. The method of claim 1, wherein step (c) includes forming the GaN-based epitaxial layer on the buffer structure and laminating a buffer layer, a channel layer, a blocking layer, a capping layer, and an electrode layer on the GaN-based epitaxial layer.

5. The method of claim 1, wherein the physical vapor deposition technique used in step (b) is a sputter technique or a molecular beam epitaxy technique.

6. The method of claim 1, wherein the chemical vapor deposition technique used in step (c) is a metal organic chemical vapor deposition technique or a hydride vapor phase epitaxy technique.

* * * * *